United States Patent [19]

Barlow

[11] 4,076,353
[45] Feb. 28, 1978

[54] MOUNTING ARRANGEMENTS AND UNITS FOR USE THEREIN
[75] Inventor: Alan Barlow, Cheltenham, England
[73] Assignee: Smiths Industries Limited, London, England
[21] Appl. No.: 661,221
[22] Filed: Feb. 25, 1976
[51] Int. Cl.² .................... A47B 88/00; H02B 9/00
[52] U.S. Cl. .......................... 312/350; 312/330 R; 361/390
[58] Field of Search ............. 312/320, 350, 330, 333; 317/101 DH, 101 CB; 403/320, 343

[56] References Cited
U.S. PATENT DOCUMENTS

| 2,620,251 | 12/1952 | Restivo | 312/350 |
| 3,271,626 | 9/1966 | Howrilka | 317/101 DH |
| 3,476,982 | 11/1969 | Bell et al. | 317/101 DH |
| 3,566,193 | 2/1971 | Jorgensen | 317/101 DH |
| 3,878,438 | 4/1975 | Weisman | 317/101 DH |
| 3,899,721 | 8/1975 | Borchard et al. | 317/101 DH |
| 3,925,710 | 12/1975 | Ebert | 317/101 DH |
| 3,932,016 | 1/1976 | Ammenheuser | 317/101 DH |

FOREIGN PATENT DOCUMENTS

| 1,354,308 | 1964 | France | 312/320 |
| 941,817 | 11/1963 | United Kingdom | 312/330 |

Primary Examiner—Paul R. Gilliam
Assistant Examiner—Victor N. Sakran
Attorney, Agent, or Firm—Pollock, Vande Sande & Priddy

[57] ABSTRACT

A rack for mounting electronic equipment comprises two spaced plates each having a series of aligned channels. Each item of electronic equipment is carried by a frame which is located in the guideway defined by an opposed pair of channels, and the frame is individually clamped in each channel. Large items of equipment are held in several frames interconnected by resilient metal strips, but each frame is still individually locked in its respective pair of channels. Thus each frame has an independent thermal path to each plate, with predictable, uniform characteristics; in addition, the entire assembly is resistant to dynamic loads. The plates and/or the frames may be force-ventilated.

4 Claims, 2 Drawing Figures

4,076,353

MOUNTING ARRANGEMENTS AND UNITS FOR USE THEREIN

BACKGROUND OF THE INVENTION

This invention relates to mounting arrangements and units for use therein.

The invention is especially concerned with mounting arrangements for electrical equipment.

SUMMARY OF THE INVENTION

According to one aspect of the present invention, a mounting arrangement comprises a rack formed by two spaced series of projections that define a plurality of guideways side by side, in combination with units each of which is adapted to be slidable into an individual one of said guideways and which includes means for locking that unit in its respective guideway by a clamping action effected in conjunction with both series of projections.

A plurality of said units may be coupled by resilient means to form an integral assembly, the resilient means being adapted to maintain the relative disposition of the units in the assembly upon removal from said mounting arrangement.

The locking means may involve a wedge-lock action by which a portion of the unit associated with each series of projections is urged into direct face-to-face abutment with a projection. In this respect, and according to another aspect of the present invention, a unit for use in a mounting arrangement includes a mechanism which is selectively actuable for clamping the unit in the arrangement, the mechanism comprising a first member mounted for movement longitudinally of the unit upon actuation of said mechanism, and a second member that is arranged to be urged sideways from the unit to abut a surface of the mounting arrangement along a substantial portion of (for example by abutment at a plurality of spaced positions along) the length of the unit in response to said longitudinal movement of the first member.

According to a further aspect of the present invention a unit for use in a mounting arrangement, comprises a frame having a plurality of elongate portions defining therebetween one or more windows for receiving items to be mounted in the plane of the frame. The items mounted in the windows of the frame may be electrical-circuit modules and electrical interconnection between different ones of the modules in the frame may be established by electrical connections that bridge cross-pieces of the frame structure.

BRIEF DESCRIPTION OF THE DRAWINGS

A mounting arrangement for electrical equipment, according to the present invention, will now be described, by way of example, with reference to the accompanying drawings, in which.

DESCRIPTION OF THE PREFERRED EMBODIMENT

The mounting arrangement to be described is of especial advantage in providing for the mounting of electronic equipment in aircraft, both as regards the rigidity of mounting provided to enable the equipment to withstand vibration and dynamic forces generally in such enviroment, but also in regard to the dissipation of heat from the equipment and electrical screening of the equipment.

Figure 1:
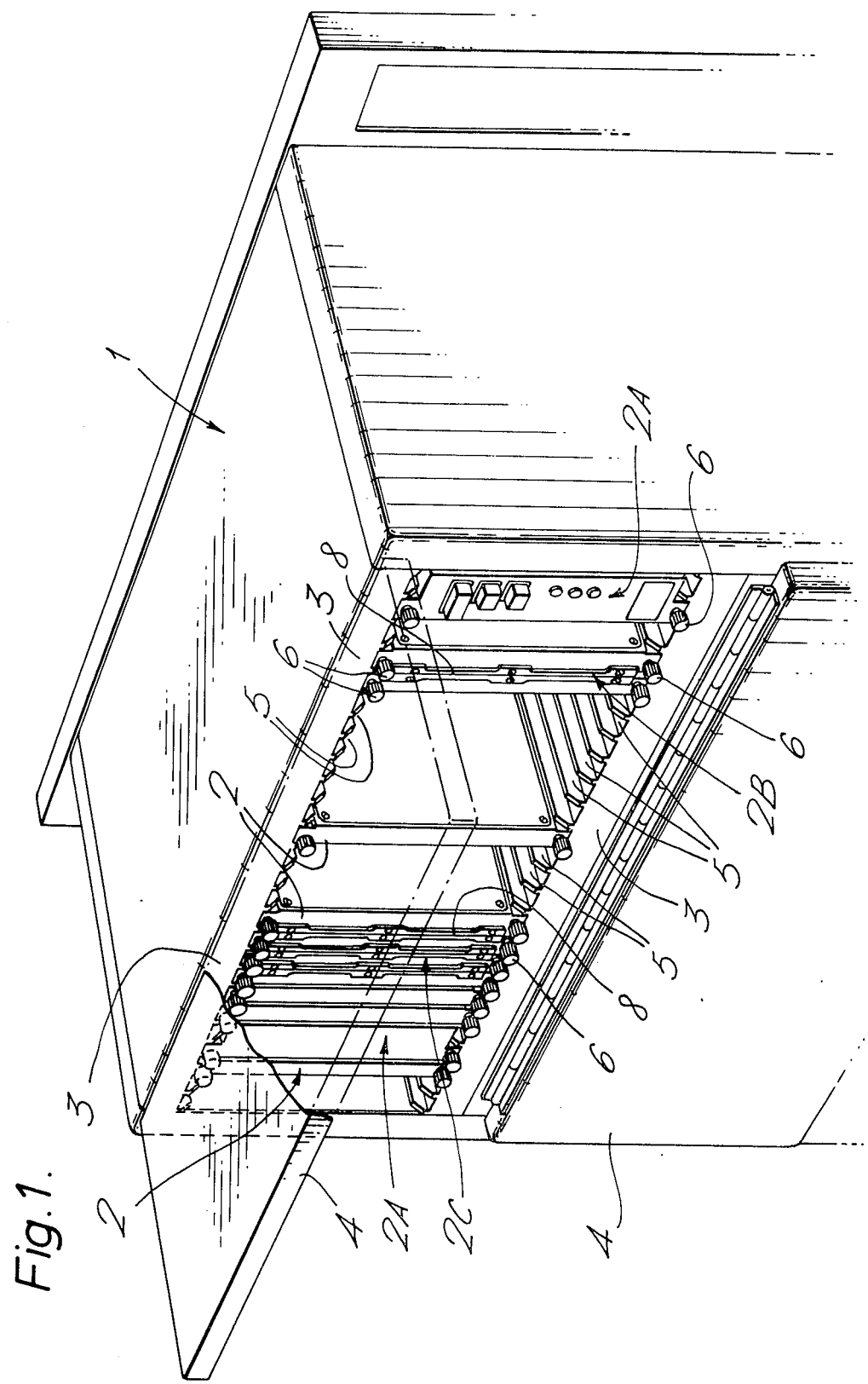
FIG. 1 is a perspective view of a part of the mounting arrangement, showing a hinged lid of the arrangement raised and revealing one of a multiplicity of racks for receiving individual units of the electrical equipment.

Referring to FIG. 1, the electrical equipment is totally enclosed within a metal cabinet 1 with the individual units 2 of the equipment mounted in racks one above the other. Each rack is defined in the space between two horizontal metal-plates 3, and the units 2 contained in it are accessible from the front of the cabinet 1 by unlocking and raising a hinged lid 4 individual to the rack. The units 2 are received in the rack within individual guideways formed by aligned upper and lower channels 5 that are machined from the opposed faces of the plates 3 to run fromt the front towards the rear of the cabinet 1. Each unit 2 is slid rearwardly into its guideway and is then locked in place by turn-screws 6 at top and bottom. This locking of the unit 2 in the rack, clamps it firmly against the projections defining the upper and lower channels 5 so as to ensure that the unit is retained in the rack with good thermal (and, if desired, electrical) connection to both plates 3 as well as rigidity of mounting.

Electrical connection with each unit 2 is made via one or more plug or socket connectors which are carried at the rear of the unit and which mate with corresponding connectors mounted on the plates 3 towards the rear of the cabinet 1. The connectors come together into their mating relationship so as thereby to establish the electrical connection automatically, as the unit continues to be slid rearwardly in completion of its insertion into the rack. The locking of the unit 2 in the rack using the turn-screws 6, ensures that the established electrical connection is maintained against any vibration to which the equipment may be subjected in use.

Any unit 2 may be removed from the cabinet 1 for maintenance, repair or replacement, simply by unlocking and raising the lid 4 of the relevant rack, twisting the two turn-screws 6 of the unit to unlock it from the rack, and then withdrawing the unit from its guideway. As the unit is withdrawn so the connectors at its rear are released from one enother, quickly breaking electrical connection to the unit.

The units 2 are of a standard rectangular format based on, for example, a height of some 8 inches, a length of 10 inches and a unit-width of 17 millimeters. Where, however, a unit wider than this is required, for example to accomodate switches, knobs, clamps or display devices, then a multiple of this unit-width may be used as in the case of each of the two double-units 2A illustrated in FIG. 1. Each double-unit 2A is of an overall width equal to double the unit-width plus the projection-width (for example, 3 millimeters), the unit being of the standard width at top and bottom to slide into the upper and lower channels of only one guideway but elsewhere being of the double width.

Two or more standard units 2 may be linked to one another so that they can be inserted and withdrawn from the rack together. For example, two units may be coupled together side by side as in the case of the unit-assembly 2B illustrated in FIG. 1, the two standard units 2 occupying individual guideways and being locked, top and bottom, in these independently of one another. Interconnection of the two units 2 in the assembly 2B is achieved by means of two resilient couplings 8 that are clamped to the two units, one at the front of the assembly and the other at the rear. More units may be involved as illustrated in FIG. 1 by the assembly 2C which comprises four standard units 2 linked one to another by couplings 8 in the same way as the units of assembly 2B. The fact that in both assemblies 2B and 2C each unit 2 is still individually clamped in the rack ensures that each unit 2 has its own independent thermal paths to the plates 3. Thus the same high degree of heat dissipation with mechanical rigidity can be achieved for each unit irrespective of the linking together.

Provision may be made for blowing air or passing other coolant between, and possibly through, the units 2 within the cabinet 1, and apertures may be provided in the upper and lower plates 3 of each rack to facilitate this.

The separate clamping of each unit 2 in the rack also enables good electrical connection to be provided, when required, for screening against interference and like purposes.

The construction of the individual units 2 will now be described in greater detail with reference to FIG. 2.

Figure 2:
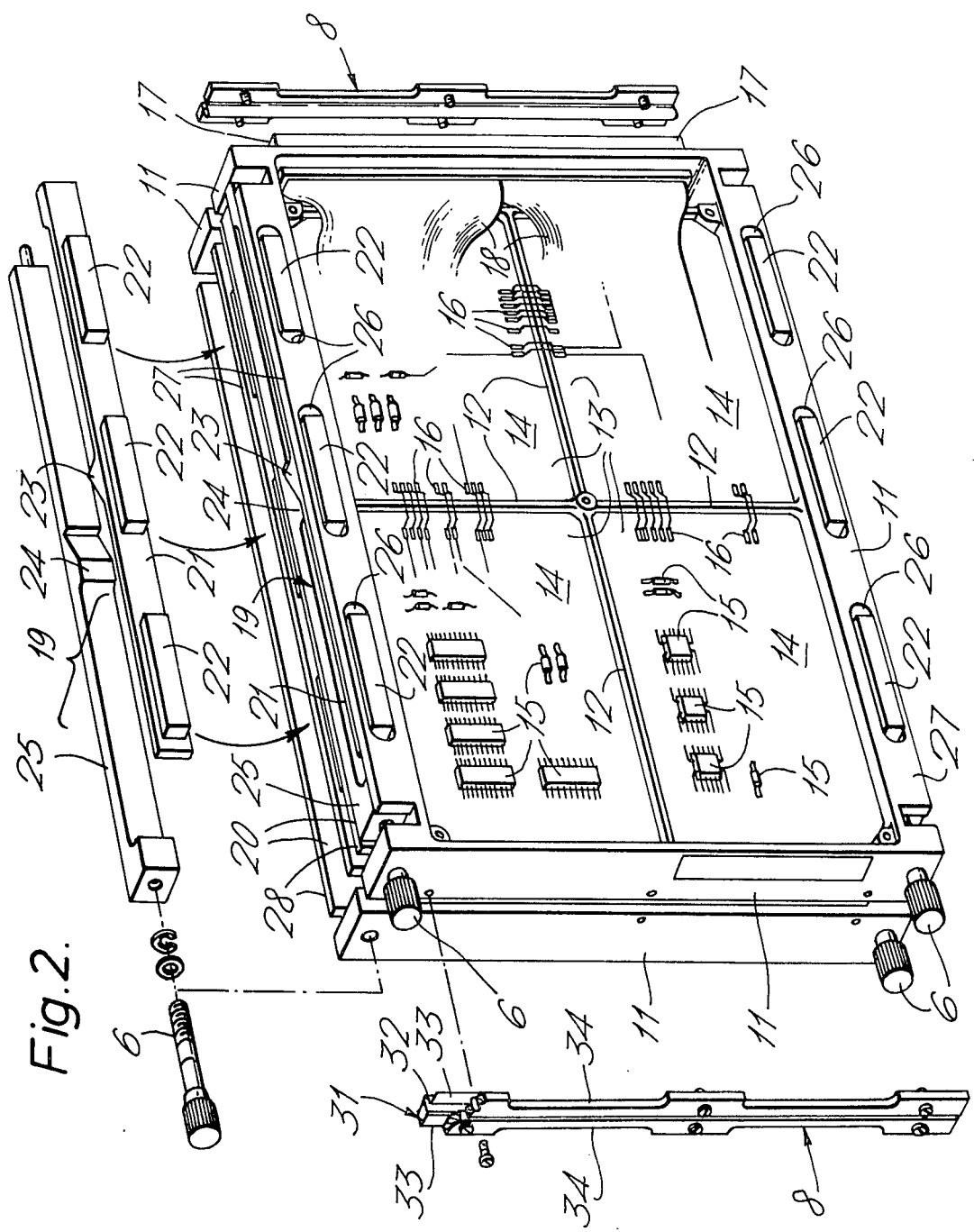
FIG. 2 is a partially exploded view of an assembly of two of the units of electrical equipment shown in FIG. 1.

Referring to FIG. 2, each unit has a rectangular metal-frame 11 that is divided by cross-pieces 12 into four separate windows each of which is occupied by the ceramic substrate 13 of an individual electrical-circuit module 14. The electrical circuit components of each module 14 are carried by the substrate 13 as discrete and integratedcircuit elements 15 with the electrical interconnections of the circuit provided in metal-layer form (not illustrated) on the substrate surfaces. Interconnection between the circuits of the different modules 14 are provided by surface-mounted conductors 16 bridging the cross-pieces 12, and between the circuits and the connectors 17 at the rear of the unit by sheaves of conductors 18.

The substrates 13, which are clamped in the windows of the frame 11 so as to ensure good thermal connection and rigid mounting, may be of a multilayer form in accordance with the circuit requirements and the packing density that is required or can be tolerated. Just four substrates 13 may be provided all inserted from the same side of the frame 11, but up to eight, four inserted from each side, may be accomodated in the specific unit illustrated. Although printed-circuits on epoxy-laminated boards may be used in place of the described modules 14, ceramic substrates are preferred in view of their better thermal conductivity. Covers (shown in FIG. 1) may be fitted to one or both sides of the frame 11 to enclose the modules 14 in the unit 2.

Each unit 2 is locked in its guideway by the action of the two turn-screws 6 on wedge-lock mechanisms 19 that lie in channels 20 along the top and bottom respectively of the frame 11. Each mechanism 19 includes a metal bar 21 which lies in the respective channel 20 and which has three spaced metal-blocks 22 on one side and a wedge-shaped cam 23 on the other. The cam 23 is opposed by a corresponding cam 24 on a metal bar 25 which is mounted within the channel 20 and which is engaged by the respective turn-screw 6 to move longitudinally of the frame 11 when the screw 6 is twisted. Twisting of the screw 6 to lock the unit in its guideway moves the bar 25 rearwardly of the unit 2 to urge the cam 24 against the cam 23 and thereby urge the bar 21 sideways to cause the blocks 22 to project through slots 26 in one side-wall 27 of the channel 20. The blocks 22 (which in modification may be combined into a single block) abut one side of the guideway-channel 5 of the relevant plate 3 (FIG. 1) to urge the other side-wall 28 of the channel 16 hard against the other side of the guideway-channel 5, and thus hold the frame 11 firmly to that plate 3 with good thermal contact for dissipation of heat from the unit. The clamping pressure on the bar 21 is released to enable the unit 2 to be withdrawn, when the turn-screw 6 is twisted in the opposite sense moving the bar 25 forwardly of the unit along the channel 20.

A quick-release fastener which is turned through 180 degrees to lock the frame 11 in place may be used in place of the screw 6.

The couplings 8 used for linking standard units 2 to one another at front and rear, each involves a resilient-metal strip 31 which bends back on itself to form a U-shape portion 32 for insertion between the frames 11 of the two units 2. The two flange portions 33 of each strip 31 on either side of the portion 32, are clamped to the frames 11 respectively, beneath metal fillet-pieces 34. The portion 32 acts in the manner of bellows providing sufficient deflection to allow for mechanical-tolerance variations in the mounting of the linked units 2, yet having sufficient stiffness to ensure that the assembly can be handled as one without damage.

I claim:

1. A mounting arrangement comprising, a rack including two spaced projections that define a guideway, a unit which is adapted to be slidable into said guideway, means on each said unit for rigidly and non-resiliently locking that unit in its respective guideway by a clamping action that exerts a force against said projections acting generally transverse to the direction of slidable movement of said unit into its respective guideway.

2. A unit for use in a mounting arrangement, including a mechanism which is selectively actuable for clamping the unit in the arrangement, the mechanism comprising first and second members both supported on said unit, said first member being mounted for movement longitudinally of the unit upon actuation of said mechanism, said second member being arranged to be urged sideways from the unit to abut a surface of the mounting arrangement along a substantial portion of the length of the unit in response to said longitudinal movement of the first member.

3. A unit as claimed in claim 2 for use in a mounting arrangement, comprising a frame having a plurality of elongate portions defining therebetween one or more windows for receiving items to be mounted in the plane of the frame.

4. A mounting arrangement comprising a rack formed by two spaced series of projections that define a plurality of guideways side by side, in combination with units each of which is adapted to be slidable into an individual one of said guideways, each unit comprising a frame having a plurality of elongate members defining therebetween one or more windows for receiving items to be mounted in the plane of the frame; and each unit including a plurality of mechanisms each of which is selectively actuable for locking that unit in its respective guideway by a clamping action effected in conjunction with a respective one of the two series of projections, each said mechanism comprising a first member supported on said unit mounted for movement longitudinally of the unit upon actuation of said mechanism, and a second member also supported on said unit that is arranged to be urged sideways from the unit to abut at least one said projection along a substantial portion of the length of the unit in response to said longitudinal movement of the first member.

* * * * *